(12) United States Patent
Park et al.

(10) Patent No.: US 12,211,649 B2
(45) Date of Patent: Jan. 28, 2025

(54) MULTILAYER CAPACITOR AND BOARD HAVING THE SAME EMBEDDED THEREIN

(71) Applicant: SAMSUNG ELECTRO-MECHANICS CO., LTD., Suwon-si (KR)

(72) Inventors: Min Cheol Park, Suwon-si (KR); Sang Jong Lee, Suwon-si (KR); Hyung Joon Kim, Suwon-si (KR); Hyun Sang Kwak, Suwon-si (KR); Chi Hyeon Jeong, Suwon-si (KR); Seong Hwan Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 240 days.

(21) Appl. No.: 17/851,542

(22) Filed: Jun. 28, 2022

(65) Prior Publication Data

US 2023/0307179 A1   Sep. 28, 2023

(30) Foreign Application Priority Data

Mar. 24, 2022   (KR) .......................... 10-2022-0036566

(51) Int. Cl.
  *H01G 4/005*   (2006.01)
  *H01G 4/12*   (2006.01)
  (Continued)

(52) U.S. Cl.
  CPC ........... *H01G 4/005* (2013.01); *H01G 4/1227* (2013.01); *H01G 4/228* (2013.01); *H01G 4/30* (2013.01);
  (Continued)

(58) Field of Classification Search
  CPC ..................... H05K 2201/10015; H01G 4/005
  See application file for complete search history.

(56) References Cited

U.S. PATENT DOCUMENTS

| | | | | |
|---|---|---|---|---|
| 4,706,162 A | * | 11/1987 | Hernandez | H01G 2/12 361/321.2 |
| 6,549,395 B1 | * | 4/2003 | Naito | H01G 4/30 361/308.1 |

(Continued)

FOREIGN PATENT DOCUMENTS

| | | |
|---|---|---|
| KR | 10-1376839 B1 | 3/2014 |
| KR | 10-2019-0116125 A | 10/2019 |

(Continued)

*Primary Examiner* — Sherman Ng
(74) *Attorney, Agent, or Firm* — MORGAN, LEWIS & BOCKIUS LLP

(57) ABSTRACT

A multilayer capacitor includes: a body including a capacitance region in which at least one first internal electrode and at least one second internal electrode are alternately laminated in a first direction with at least one dielectric layer interposed therebetween; and first and second external electrodes spaced apart from each other and respectively disposed on first and second surfaces of the body, the first and second surfaces opposing each other. The body further includes a first via electrode, connecting the at least one first internal electrode and the first external electrode to each other in the first direction, and a second via electrode connecting the at least one second internal electrode and the second external electrode to each other in the first direction.

24 Claims, 6 Drawing Sheets

(51) Int. Cl.
*H01G 4/228* (2006.01)
*H01G 4/30* (2006.01)
*H05K 1/18* (2006.01)

(52) U.S. Cl.
CPC ... *H05K 1/182* (2013.01); *H05K 2201/10015* (2013.01)

(56) References Cited

U.S. PATENT DOCUMENTS

| | | |
|---|---|---|
| 10,629,376 B2 | 4/2020 | Kim et al. |
| 2006/0198079 A1* | 9/2006 | Shim ................ H01G 2/06 361/306.3 |
| 2014/0104750 A1 | 4/2014 | Ahn et al. |
| 2018/0218840 A1* | 8/2018 | Watabe ............ H01G 4/232 |
| 2020/0051745 A1* | 2/2020 | Park ................ H01G 4/1227 |
| 2020/0126722 A1* | 4/2020 | Fukunaga ............ H01G 4/306 |
| 2020/0194182 A1 | 6/2020 | An et al. |
| 2021/0005389 A1 | 1/2021 | Lee et al. |
| 2021/0057159 A1* | 2/2021 | Lee ................ H01G 4/012 |

FOREIGN PATENT DOCUMENTS

| | | |
|---|---|---|
| KR | 10-2019-0136678 A | 12/2019 |
| KR | 10-2020-0075287 A | 6/2020 |

* cited by examiner

MULTILAYER CAPACITOR AND BOARD HAVING THE SAME EMBEDDED THEREIN

CROSS-REFERENCE TO RELATED APPLICATION(S)

This application claims benefit of priority to Korean Patent Application No. 10-2022-0036566 filed on Mar. 24, 2022 in the Korean Intellectual Property Office, the disclosure of which is incorporated herein by reference in its entirety.

TECHNICAL FIELD

The present disclosure relates to a multilayer capacitor and a board having the same embedded therein.

A multilayer capacitor is widely used as a component for electronic devices such as computers, mobile phones, and the like, due to advantages thereof such as guaranteed high capacitance even with a small size, and ease of mounting thereof on a board, and is widely used as a component for electric devices (including vehicles) due to characteristics thereof such as high reliability and high strength.

With the high performance and/or ultra-high density integration of electronic devices or electrical devices, miniaturization efficiency of multilayer capacitors is also becoming increasingly important. However, since it may be difficult to improve capacitance to volume of a multilayer capacitor as the multilayer capacitor is miniaturized, capacitance to volume is becoming an increasingly important consideration.

SUMMARY

An aspect of the present disclosure is to provide a multilayer capacitor.

According to an aspect of the present disclosure, a multilayer capacitor includes: a body including a capacitance region in which at least one first internal electrode and at least one second internal electrode are alternately laminated in a first direction with at least one dielectric layer interposed therebetween; and first and second external electrodes spaced apart from each other and respectively disposed on first and second surfaces of the body, the first and second surfaces opposing each other. The body further includes a first via electrode, connecting the at least one first internal electrode and the first external electrode to each other in the first direction, and a second via electrode connecting the at least one second internal electrode and the second external electrode to each other in the first direction. The first external electrode covers the first surface of the body by an area exceeding half of the first surface, and the second external electrode covers the second surface of the body by an area exceeding half of the second surface.

According to an aspect of the present disclosure, a multilayer capacitor includes: a body including a capacitance region in which at least one first internal electrode and at least one second internal electrode are alternately laminated in a first direction with at least one dielectric layer interposed therebetween; and first and second external electrodes spaced apart from each other and respectively disposed on first and second surfaces of the body, the first and second surfaces opposing each other. The body further includes a first via electrode, connecting the at least one first internal electrode and the first external electrode to each other in the first direction, and a second via electrode connecting the at least one second internal electrode and the second external electrode to each other in the first direction. The first external electrode overlaps the second via electrode in the first direction, and the second external electrode overlaps the first via electrode in the first direction.

According to an aspect of the present disclosure, a board includes: a first insulating layer having a cavity; a first conductive pattern disposed on a first surface of the first insulating layer; a second conductive pattern disposed on a second surface of the first insulating layer; and the multilayer capacitor embedded in the board and disposed in the cavity. The first external electrode of the multilayer capacitor is electrically connected to the first conductive pattern, and The second external electrode of the multilayer capacitor is electrically connected to the second conductive pattern.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Figure 1:
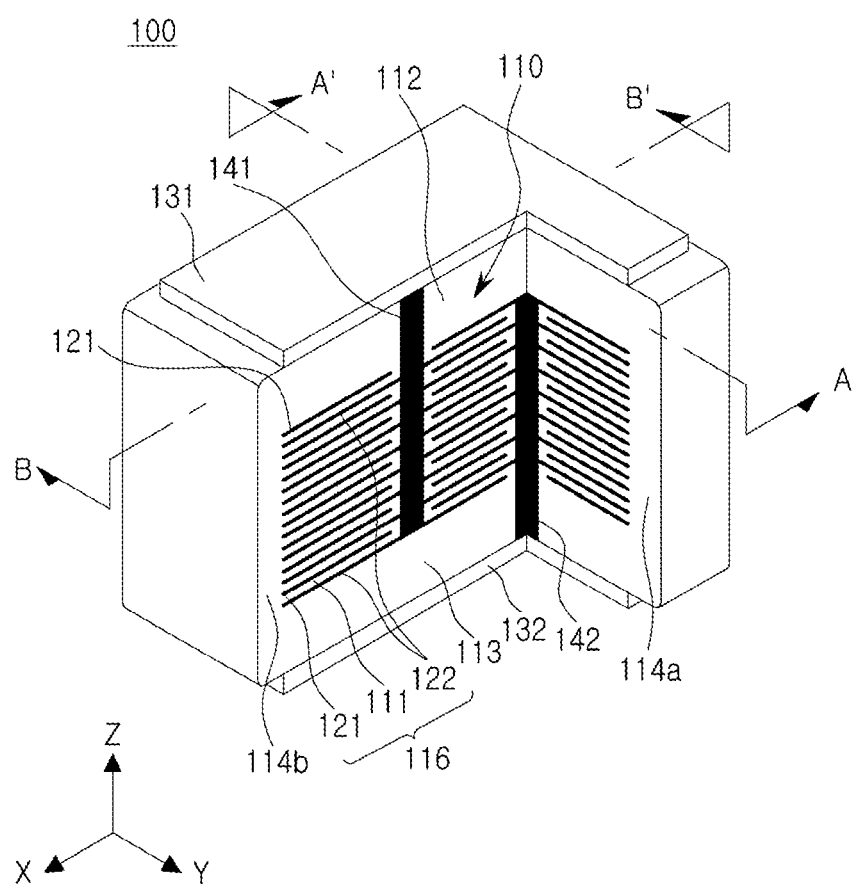
FIG. 1 is a perspective view illustrating the inside of a multilayer capacitor according to an embodiment of the present disclosure.

Embodiments of the present disclosure can be modified to have various other forms, and the scope of the present disclosure is not limited to the embodiments described below. Furthermore, the embodiments of the present disclosure are provided to more fully describe the present disclosure to those skilled in the art. Accordingly, the shapes and sizes of the elements in the drawings may be exaggerated for clarity of description, and the elements denoted by the same reference numerals in the drawings are the same elements.

In order to clearly illustrate the present disclosure in the drawings, thicknesses have been enlarged for the purpose of clearly illustrating the layers and regions, and an element having the same function within the scope of the same idea may be explained using the same symbol.

Throughout the specification, when an element is referred to as "comprising," it means that it can include other elements as well, without excluding other elements unless specifically stated otherwise.

When the direction of the parallelepiped is defined to clearly describe the embodiments of the present disclosure, X, Y, and Z indicated in the drawings represent a length (L) direction, a width (W) direction, and a thickness (T) direction, respectively. In this case, the thickness direction may be used as the same concept as a laminating direction in which the dielectric layers are laminated (or a first direction).

Hereinafter, a multilayer capacitor according to an embodiment will be described, and in detail, a multilayer ceramic capacitor (MLCC) will be described, but the present disclosure is not limited thereto.

Figure 2:
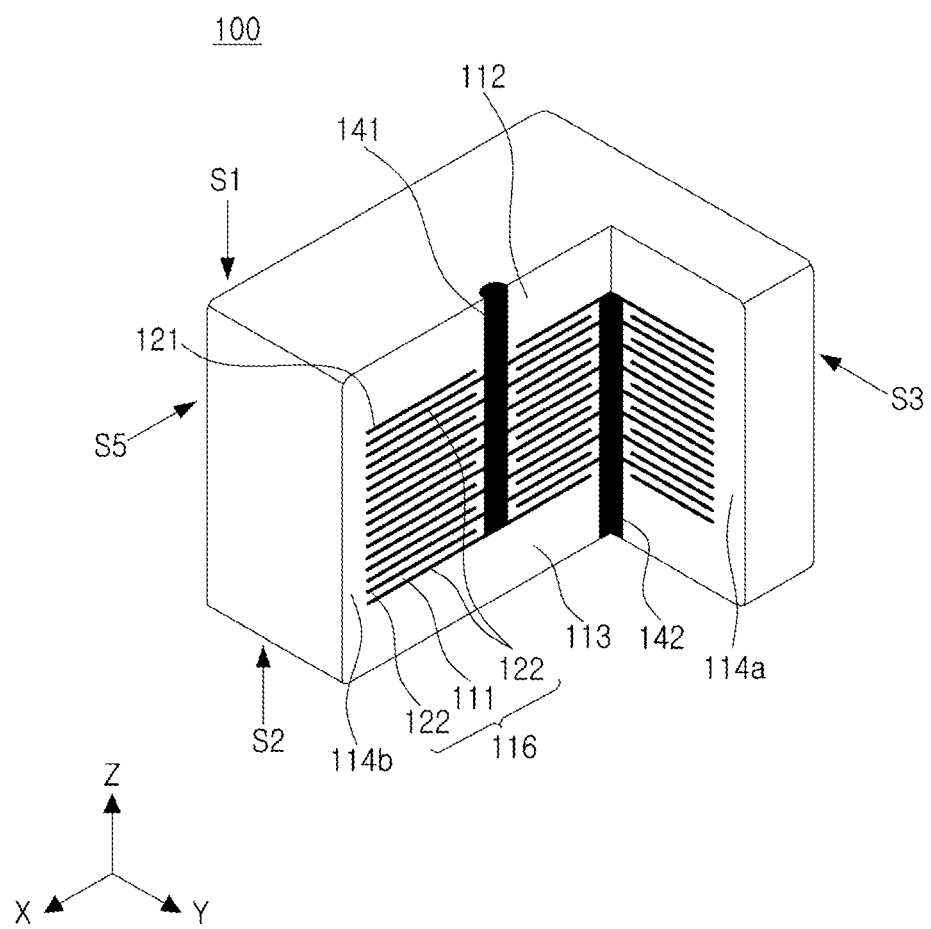
FIG. 2 is a perspective view illustrating a body of the multilayer capacitor of FIG. 1.
Figure 3:
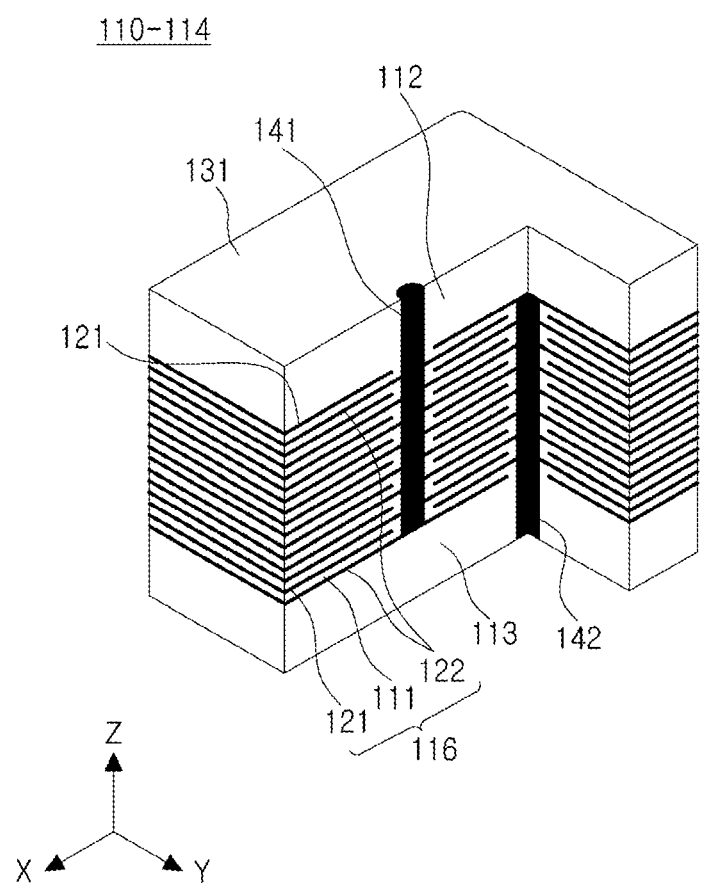
FIG. 3 is a perspective view illustrating a structure in which a side margin layer is removed from the body of FIG. 2.

Referring to FIGS. 1 to 5, a body 110 of a multilayer capacitor 100 according to an embodiment may include a capacitance region 116 in which at least one first internal electrode 121 and at least one second internal electrode 122 are alternately laminated in a first direction (for example, a Z-direction) with at least one dielectric layer 111 interposed therebetween. FIGS. 1 to 3 illustrate a shape cut by about ¼ of the volume to illustrates the inside of the body 110, but the actual multilayer capacitor 100 may not be cut by about ¼ of the volume and may be substantially symmetrical with respect to a center of the body 110.

The body 110 may have first and second surfaces S1 and S2 opposing each other in a first direction (for example, a Z-direction). For example, the body 110 may be formed to have a shape of a hexahedron further having third and fourth surfaces S3 opposing each other in a second direction (for example, a Y-direction), perpendicular to the first direction (for example, the Z-direction), and fifth and sixth surfaces S5 opposing each other in a third direction (for example, an X-direction), perpendicular to the first and second directions. The hexahedron may be rounded by polishing edges and/or corners thereof. However, the shape and size of the body 110 and the number of laminated dielectric layers 111 are not limited to those illustrated in the present embodiment.

For example, a thickness T0 of the body 110 in the first direction (for example, the Z-direction) is smaller than a width W2 of the body 110 in the second direction (for example, the Y-direction) and smaller than a length L0 of the body 110 in the third direction (for example, the X-direction). For example, the volume of the body 110 may be 1608 in size, 1005 in size, 0603 in size, or 0402 in size. In 0402 in size, '04' and '02' indicate that the length L0 and the width W2 are about 0.4 mm and 0.2 mm, respectively. The multilayer capacitor 100 according to an embodiment may be more efficient for an ultra-small body 110 such as a body having 0603 in size or 0402 in size, but example embodiments are not limited thereto.

For example, the body 110 may be formed as a ceramic body by sintering the capacitance region 116. In this case, at least one dielectric layer 111 disposed in the body 110 is in a sintered state, and adjacent dielectric layers may be integrated, such that boundaries therebetween may not be readily apparent without using a scanning electron microscope (SEM).

A thickness of the at least one dielectric layer 111 may be arbitrarily changed depending on a capacitance design of the multilayer capacitor 100, and may include ceramic powder particles having a high dielectric constant, for example, barium titanate ($BaTiO_3$)-based powder particles, but example embodiments are not limited thereto. The ceramic powder particles may include at least one of, for example, strontium titanate ($SrTiO_3$)-based, calcium titanate ($CaTiO_3$)-based, and calcium zirconate ($CaZrO_3$)-based powder particles, and a portion of the ceramic powder particles may be solid-solubilized as barium (Ba) and/or titanium (Ti) of barium titanate (BaTiO3) is substituted with another element (for example, a rare earth element). In addition, various ceramic additives (for example, MgO, $Al_2O_3$, $SiO_2$, and ZnO), organic solvents, plasticizers, binders, dispersants, or the like, may be added to the ceramic powder particles according to the required specifications of the multilayer capacitor 100. For example, the ceramic powder particles may include polyvinyl alcohol (PVA), polyvinyl butyral (PVB), acrylic resin, or the like, as a binder.

An average particle diameter of the ceramic powder used to form the at least one dielectric layer 111 is not limited, and may be adjusted according to a required standard of the multilayer capacitor 100 (for example, miniaturization and/or high capacitance in, for example, a capacitor for electronic devices, or high withstand voltage characteristics and/or strong strength in, for example, a capacitor for electrical devices), but may be adjusted to, for example, 400 nm or less.

For example, the at least one dielectric layer 111 may be formed by applying and drying a slurry formed including powder such as barium titanate ($BaTiO_3$) on a carrier film and thus providing a plurality of ceramic sheets. The ceramic sheet may be formed by preparing a slurry by mixing ceramic powder, a binder, and a solvent, and preparing the slurry in a sheet shape having a thickness of several micrometers (μm) by a doctor blade method, but the formation method is not limited thereto.

The at least one first internal electrode 121 and the at least one second internal electrode 122 may be alternately formed by printing a conductive paste including a conductive metal in the laminating direction (for example, Z-direction) of the dielectric layers, and may be electrically insulated from each other by a dielectric layer interposed therebetween.

For example, each of the at least one first internal electrode 121 and the at least one second internal electrode 122 may be formed of a conductive paste for an internal electrode, having an average particle size of 0.1 to 0.2 μm and having 40 to 50% by weight, but the material is not limited thereto. The conductive paste may be one of nickel (Ni), copper (Cu), palladium (Pd), silver (Ag), lead (Pb) or platinum (Pt) alone, or alloys thereof, but example embodiments are not limited thereto.

For example, an internal electrode pattern may be formed by applying the internal electrode conductive paste to the ceramic sheet in a printing method or the like. As the method of printing the conductive paste, a screen-printing method, a gravure printing method, an inkjet printing method, or the like may be used, but example embodiments are not limited thereto. For example, the body 110 may be manufactured by laminating 200 to 300 layers of the ceramic sheet on which the internal electrode pattern is printed, pressing, and sintering the same.

The capacitance of the multilayer capacitor 100 may be proportional to an overlapping area of the at least one first internal electrodes 121 and the at least one second internal electrodes 122 in the laminating direction (for example, in the Z-direction), be proportional to the total number of laminating of the at least one first internal electrodes 121 and the at least one second internal electrodes 122, and be inversely proportional to a distance between the at least one first internal electrode 121 and the at least one second internal electrode 122. The distance may be substantially equal to the thickness of the at least one dielectric layer 111.

The multilayer capacitor 100 may have a relatively greater capacitance, compared to a thickness, as the distance between the at least one first internal electrode 121 and the at least one second internal electrode 122 decreases. A withstand voltage of the multilayer capacitor 100 may be increased as the distance increases. Therefore, the distance between the internal electrodes may be adjusted according to the required standard of the multilayer capacitor 100 (for example, requirements for miniaturization and/or high capacitance such as in a capacitor for electronic devices, requirements for high withstand voltage characteristics and/or strong strength such as in a capacitor for an electric device, or the like). A thickness of each of the at least one first internal electrode 121 and the at least one second internal electrode 122 may also be affected by the distance between the internal electrodes.

For example, in the multilayer capacitor 100, when relatively high withstand voltage characteristics and/or strong strength are required, the distance between the at least one first internal electrode 121 and the at least one second internal electrode 122 may be designed to exceed twice each thickness. For example, when miniaturization and/or high capacitance are required, the multilayer capacitor 100 may be designed such that each of the first internal electrode 121 and the second internal electrode 122 has a thickness of 0.4 µm or less and the total number of laminates thereof is 400 or more.

Referring to FIGS. 1 to 5, the multilayer capacitor 100 according to an embodiment may include first and second external electrodes 131 and 132 spaced apart from each other and disposed on the body 110. The first external electrode 131 may be disposed on the first surface S1 of the body 110, and the second external electrode 132 may be disposed on the second surface S2 of the body 110.

The multilayer capacitor 100 may provide capacitance, formed in the capacitance region 116, to an external structure (for example, a board or a circuit) through the first and second external electrodes 131 and 132. For example, the multilayer capacitor 100 may be mounted or embedded in an external board (for example, a printed circuit board), and may be connected to at least one of wires, lands, solders, or bumps of the external board through the first and second external electrodes 131 and 132 to be electrically connected to a circuit (for example, an integrated circuit or a processor) electrically connected to the external board.

For example, each of the first and second external electrodes 131 and 132 may be formed by a process of dipping in a paste containing a metal component, a process of printing a conductive paste, a sheet transfer process, a pad transfer process, a sputter plating process, an electrolytic plating process, or the like. The metal component may be one of copper (Cu), nickel (Ni), palladium (Pd), platinum (Pt), gold (Au), silver (Ag), lead (Pb), tin (Sn), or the like alone, or alloys thereof, but example embodiments are not limited thereto.

Referring to FIGS. 1 to 5, the body 110 of the multilayer capacitor 100 according to an embodiment may further include a first via electrode 141, connecting the at least one first internal electrode 121 and the first external electrode 131 to each other in the first direction (for example, in the Z-direction), and a second via electrode 142 connecting the at least one second internal electrode 122 and the second external electrode 132 to each other in the first direction (for example, in the Z-direction).

Accordingly, the multilayer capacitor 100 may provide the capacitance, formed in the capacitance region 116, to the first and second external electrodes 131 and 132 in the first direction (for example, in the Z-direction) and may not provide the capacitance, formed in the capacitance region 116, in the second direction (for example, in the Y-direction) or the third direction (for example, in the X-direction). For example, the body 110 may be configured to not provide (or exclude) a path, electrically connected to the at least one first internal electrode 121 and the at least one second internal electrode 122, through the third and fourth surfaces S3 of the body 110 or the fifth and sixth surfaces S5.

Accordingly, the at least one first internal electrode 121 and the at least one second internal electrode 122 may be formed without considering possibility of occurrence of short-circuit in the third and fourth surfaces S3 of the body 110 or a need for improvement of step-dependent reliability, and may be formed without considering possibility of occurrence of short-circuit in the fifth and sixth surfaces S5 of the body 110 or a need for improvement of step-dependent reliability. The need for improvement of step-dependent reliability may be due to a shape in which edges of the at least one first internal electrode 121 and the at least one second internal electrode 122 are offset to a center of the third and fourth surfaces S3 or a center of the fifth and sixth surfaces S5 during compression and sintering of the body 110 when the at least one first internal electrode 121 and the at least one second internal electrode 122 are alternately exposed to the third and fourth surfaces S3 or the fifth and sixth surfaces S5.

For example, a gap between the at least one first internal electrode 121 and the third and fourth surfaces S3 of the body 110 may be the same as a gap between the at least one second internal electrode 122 and the third and fourth surfaces S3 of the body 110, and may be reduced overall. For example, a gap between the at least one first internal electrode 121 and the fifth and sixth surfaces S5 of the body 110 may be the same as a gap between the at least one second internal electrode 122 and the fifth and sixth surfaces S5 of the body 110, and may be reduced overall.

Accordingly, a ratio of an area of an X-Y plane of the capacitance region 116 to an area of an X-Y plane of the body 110 may be efficiently increased, so that the multilayer capacitor 100 may have high capacitance as compared with a total effective size.

In addition, since the first and second external electrodes 131 and 132 are respectively disposed on the first and second surfaces S1 and S2, the first and second external electrodes 131 and 132 may be formed without considering occurrence of short-circuit therebetween. For example, as compared with the case in which the first and second external electrodes 131 and 132 are formed in different positions on one surface of the body 110, the first and second external electrodes 131 and 132 of the multilayer capacitor 100 according to an embodiment may be formed by a more freely selected method (for example, paste dipping, printing, transfer, or plating), thicknesses of the first and second external electrodes 131 and 132 may be more efficiently reduced, and reliability of the first and second external electrodes 131 and 132 may be more efficiently secured. Such advantages may become more important as the volume (for example, 1608 in size, 1005 in size, 0603 in size, 0402 in size) of the body 110 is reduced.

For example, the first external electrode 131 may cover the first surface S1 by an area exceeding half of the first surface S1 of the body 110, and the second external electrode 132 may cover the second surface S2 by an area exceeding half of the second surface S2 of the body 110. For example, the first external electrode 131 may overlap the second via electrode 142 in the first direction (for example, in the Z-direction), and the second external electrode 132 may overlap the first via electrode 141 in the first direction (for example, in the Z-direction).

An area of each of the first and second surfaces S1 and S2 of the body 110 may be measured based on the product of a length L0 and a width W2 of the body 110, and an area of each of the first and second electrodes 131 and 132 may be measured based on the product of a length L1 and a width W1 of each of the first and second external electrodes 131 and 132. For example, the area may be measured based on the number of pixels of an image obtained in the first direction (for example, in Z-direction) by a measurement apparatus (for example, a transmission electron microscopy (TEM), an atomic force microscope (AFM), a scanning electron microscope (SEM), an optical microscope, or a surface profiler).

The larger an area of each of the first and second external electrodes 131 and 132 compared with an area of each of the first and second surfaces S1 and S2 of the body 110, the higher the degree of freedom of arrangement of the first and second via electrodes 141 and 142 within the body 110. For example, the first and second via electrodes 141 and 142 may be disposed at appropriately determined positions to increase capacitance to the volume of the body 110 or to decrease equivalent series inductance (ESL).

For example, as compared with the case in which the first and second external electrodes 131 and 132 are formed in different positions on one surface of the body 110, an X-Y plane component in an overall path of current flowing through the multilayer capacitor 100 according to an embodiment may be further reduced overall, so that a length of the overall path of the current may be decreased. Thus, the ESL of the multilayer capacitor 100 may be effectively decreased.

When the first and second external electrodes 131 and 132 are formed in different positions on one surface of the body 110, current flowing between the first and second external electrodes 131 and 132 may flow in a winding direction through the body 110. However, the path of the current flowing between the first and second external electrodes 131 and 132 of the multilayer capacitor 100 according to an embodiment may rarely include the winding path. Since the winding path of the current may be a factor to increase ESL, the multilayer capacitor 100 according to an embodiment may reduce the winding path of the current to effectively decrease ESL.

For example, a gap L2 between the first and second via electrodes 141 and 142 may be smaller than half of the length L1 of the body 110 in a direction (for example, an X-direction) in which the first and second via electrodes 141 and 142 oppose each other. The direction, in which the first and second via electrodes 141 and 142 oppose each other, is not limited to the X-direction. For example, when the direction in which the first and second via electrodes 141 and 142 oppose each other is a Y-direction, the gap L2 between the first and second via electrodes 141 and 142 may be smaller than half of a width W2 of the body 110. For example, when the direction in which the first and second via electrodes 141 and 142 oppose each other is a direction rotated from the X-direction by 45 degrees on the X-Y plane, the gap L2 between the first and second via electrodes 141 and 142 may be smaller than half of a square root of the sum of a square of the length L1 of the body 110 and a square of the width W2 of the body 110.

Referring to FIGS. 1 to 5, the body 110 may include at least one of a first cover layer 112, a second cover layer 113, first and second side margin layers 114a, and third and fourth side margin layers 114b.

The first and second side margin layers 114a may be disposed such that the capacitance region 116 is interposed therebetween in the second direction (for example, in the Y-direction), and the third and fourth side margin layers 114b may be disposed such that the capacitance region 116 is interposed therebetween in the third direction (for example, in the X-direction). For example, the first and second side margin layers 114a and the third and fourth side margin layers 114b may include the same material as the at least one dielectric layer 111 (for example, a barium titanate ($BaTiO_3$)-based ceramic material) or other materials (for example, a thermosetting resin such as an epoxy resins).

For example, the first and second side margin layers 114a and the third and fourth side margin layers 114b may be separately formed for the capacitance region 116 by a margin formation (MF) method, and may then be laminated in the second direction (for example, the Y-direction) and the third direction (for example, the X-direction) for a structure 110-114 in which the at least one first internal electrode 121 and the at least one second internal electrode 122 are exposed. Each of the at least one first internal electrode 121 and the at least one second internal electrode 122 may be in contact with each of the first and second side margin layers 114a and the third and fourth side margin layers 114b. For example, the exposure of the at least one first internal electrode 121 and the at least one second internal electrode 122 may be performed by cutting the capacitance region 116 in an X-Z plane or a Y-Z plane in a large-sized structure.

Since the capacitance formed in the capacitance region 116 does not need to be provided in the second direction (for example, in the Y-direction) or the third direction (for example, in the X-direction), the multilayer capacitor 100 according to an embodiment may secure reliability even when the thickness T1 of each of the first and second side margin layers 114a and the thickness T2 of each of the third and fourth side margin layers 114b are small.

For example, the thickness T1 of each of the first and second side margin layers 114a may be greater than 0 μm to 20 μm or less, or may be less than the thickness T3 of each of the first and second cover layers 112 and 113. For example, the thickness T2 of each of the third and fourth side margin layers 114b may be greater than 0 μm to 20 μm or less, or may be less than the thickness T3 of each of the first and second cover layers 112 and 113.

The first and second cover layers 112 and 113 may be disposed with the capacitance region 116 interposed therebetween in the first direction (for example, in the Z-direction) and may each have a thickness, greater than a thickness of each of the at least one dielectric layer 111. The first cover layer 112 may provide the first surface S1 of the body 110, and may be disposed between the first external electrode 131 and the capacitance region 116. The second cover layer 113 may provide the second surface S2 of the body 110, and may be disposed between the second external electrode 132 and the capacitance region 116. For example, the first and second cover layers 112 and 113 may include the same material (for example, a barium titanate ($BaTiO_3$)-based ceramic material) as the at least one dielectric layer 111, or a material (for example, a thermosetting material such as an epoxy resin), different from a material of the at least one dielectric layer 111.

For example, the first cover layer 112 may be disposed between the first external electrode 131 and the at least one first internal electrode 121, and the second via electrode 142 may not penetrate the first cover layer 112. For example, the second cover layer 113 may be disposed between the second external electrode 132 and the at least one second internal electrode 122, and the first via electrode 141 may not penetrate the second cover layer 113.

As compared with edges (portions close to the external electrodes) of the at least one first internal electrode 121 and the at least one second internal electrode 122, the first and second cover layers 112 and 113 may be formed without considering possibility of occurrence of short-circuit between the first internal electrode 121 and the second external electrode 132, possibility of occurrence of short-circuit between the at least one second internal electrode 122 and the first external electrode 131, or possibility of permeation of moisture/foreign objects. In addition, since the first and second external electrodes 131 and 132 may have higher strength based on a metallic material which may be contained therein, a burden of securing strength of the first and second cover layers 112 and 113 may be reduced. Accordingly, the first and second cover layers 112 and 113 may be formed to be thin, and the number of laminated layers of the capacitance region 116 compared to the thickness T0 of the body 110 may be efficiently secured, and high capacitance to volume of the body 110 may be secured.

For example, the first cover layer 112 may provide a portion of the first through-hole VH1 formed such that the first via electrode 141 is disposed therein, and the second cover layer 113 may provide a portion of the second through-hole VH2 formed such that the electrode 142 is disposed therein. For example, the first through-hole VH1 may be formed from the first surface S1 of the body 110 in a negative Z-direction, and the second through-hole VH2 may be formed from the second surface S2 of the body 110 in a positive Z-direction.

For example, the first and second through-holes VH1 and VH2 may be formed by drilling or laser irradiation. The first and second via electrodes 141 and 142 may be formed by filling or plating at least a portion of the first and second through-holes VH1 and VH2 with a conductive paste. The at least one first internal electrode 121 may have a relatively small hole corresponding to the first through-hole VH1 and a relatively large hole corresponding to the second through-hole VH2, and the at least one second internal electrode 122 may have a relatively large hole corresponding to the first through-hole VH1 and a relatively small hole corresponding to the second through-hole VH2. The relatively large holes of the at least one first internal electrode 121 and the at least one second internal electrode 122 may be a structure to be spaced apart from the first via electrode 141 or the second via electrode 142, and the relatively small holes of the at least one first internal electrode 121 and the at least one second internal electrode 122 may be a structure to be connected to the first via electrode 141 or the second via electrode 142.

For example, the number of via electrodes provided by (or present in) the body 110 may be two, including the first and second via electrodes 141 and 142. For example, the number of each of the first and second via electrodes 141 and 142 may be one in the entire body 110.

Accordingly, the number of holes and a total area of the holes of each of the at least one first internal electrode 121 and the at least one second internal electrode 122 may be decreased, so that an overlapping area of the at least one first internal electrode 121 and the at least one second internal electrode 122 in the first direction (for example, in the Z-direction) may be efficiently increased and high capacitance to volume of the body 110 may be secured. In addition, diameters of the first and second via electrodes 141 and 142 may be efficiently secured, so that connectivity of the first and second via electrodes 141 and 142 to the internal electrode or the external electrode may be secured and equivalent series resistance may also be reduced.

For example, the first via electrode 141 may not be exposed to the second surface S2 of the body 110, and the second via electrode 142 may not be exposed to the first surface S1 of the body 110. For example, the first cover layer 112 may not provide a space in which the second via electrode 142 is disposed, and the second cover layer 113 may not provide a space in which the first via electrode 141 is disposed. For example, a midpoint of the first via electrode 141 may be offset from a midpoint of the second via electrode 142 along the first direction. The midpoint may refer to the middle point of a length of the via electrode in the first direction. In some embodiments, ends of the first and second via electrodes 141 and 142 are disposed at different depths in the body 110.

For example, at least a portion of the first and second external electrodes 131 and 132 may be a plating layer formed by plating (for example, sputtering or chemical vapor deposition (CVD)), and portions of the electrodes 131 and 132 in contact with the first and second via electrodes 141 and 142 may be plating layers. Accordingly, a thickness T4 of each of the first and second external electrodes 131 and 132 may be effectively decreased. For example, as compared with the case in which the first and second external electrodes 131 and 132 are formed by a dipping method, the thickness T4 of each of the first and second external electrodes 131 and 132 may be decreased to be half or less. For example, the thickness T4 of each of the first and second external electrodes 131 and 132 may be greater than 0 μm to 10 μm or less. The number of layers of each of the first and second external electrodes 131 and 132 is not limited.

For example, in consideration of bleeding during the formation of the first and second external electrodes 131 and 132, the first and second external electrodes 131 and 132 may be formed to be slight smaller than the first surface S1 and the second surface S2 of the body 110. For example, each of the first and second external electrodes 131 and 132 may have a length, smaller than a length of the capacitive region 116 by the extra length L3, and may have a width, smaller than a width of the capacitance region 116 by an extra width W3. Accordingly, the order between the formation of the first and second external electrodes 131 and 132 and the formation of the first and second side margin layers 114a or the third and fourth side margin layers 114b may be freely determined.

According to an experiment, when the body 110 of the multilayer capacitor 100 according to an embodiment has 1608 in size, a ratio of the volume of the body 110 to the volume of the capacitance region 116 may be 76.6%, the ratio of a structure providing the capacitance formed in the region 116 in the third direction (for example, the X-direction) may be 59.1%, and the ratio in the case that is not a structure, in which the first and second side margin layers 114a of the structure are formed to be as separate as in the MF method and then laminated in the capacitance region 116, may be 51.1%.

According to an experiment, when the body 110 of the multilayer capacitor 100 according to an embodiment has 1005 in size, a ratio of the volume of the body 110 to the volume of the capacitance region 116 may be 66.9%, the ratio of a structure providing the capacitance formed in the region 116 in the third direction (for example, the X-direction) may be 44.8%, and the ratio in the case that is not a structure, in which the first and second side margin layers 114a of the structure are formed to be as separate as in the MF method and then laminated in the capacitance region 116, may be 37.8%.

According to an experiment, when the body 110 of the multilayer capacitor 100 according to an embodiment has 0603 in size, a ratio of the volume of the body 110 to the volume of the capacitance region 116 may be 63.5%, the ratio of a structure providing the capacitance formed in the region 116 in the third direction (for example, the X-direction) may be 35.2%, and the ratio in the case that is not a structure, in which the first and second side margin layers 114a of the structure are formed to be as separate as in the MF method and then laminated in the capacitance region 116, may be 26.8%.

According to an experiment, when the body 110 of the multilayer capacitor 100 according to an embodiment has 0402 in size, a ratio of the volume of the body 110 to the volume of the capacitance region 116 may be 52.5%, the ratio of a structure providing the capacitance formed in the region 116 in the third direction (for example, the X-direction) may be 25.0%, and the ratio in the case that is not a structure, in which the first and second side margin layers 114a of the structure are formed to be as separate as in the MF method and then laminated in the capacitance region 116, may be 16.4%.

Figure 6:
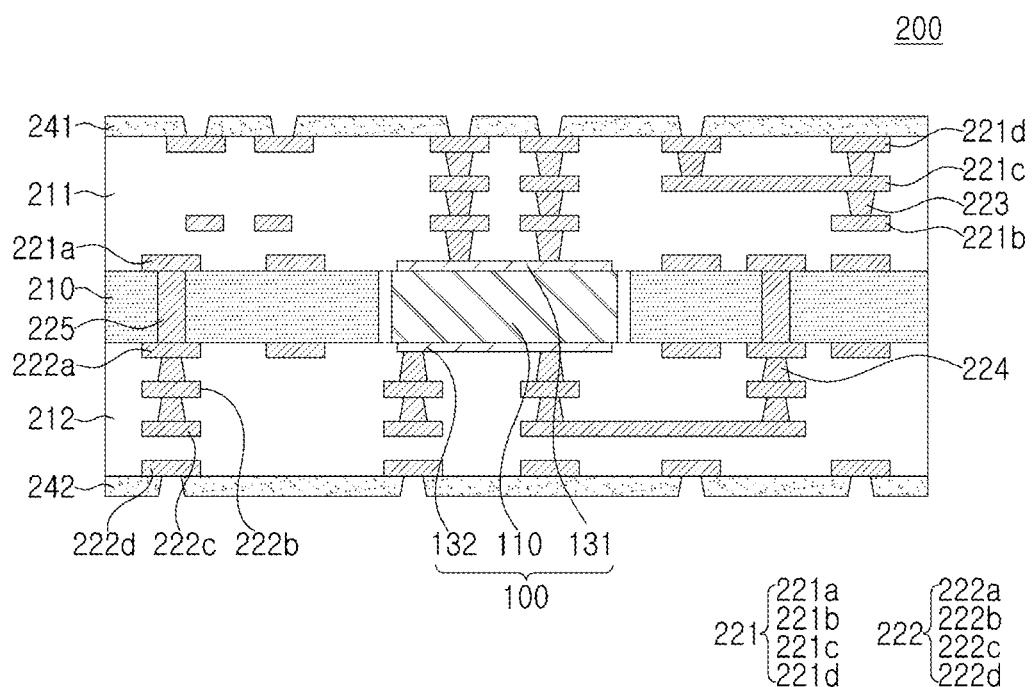
FIG. 6 is a side view illustrating a board having a multilayer capacitor embedded therein according to an embodiment of the present disclosure.

Referring to FIG. 6, a board 200 having a multilayer capacitor embedded therein according to an embodiment may include a multilayer capacitor 100, a first insulating layer 210, a first conductive pattern 221, and a second conductive pattern 222.

For example, the first insulating layer 210 may be a core insulating layer of a printed circuit board and may provide a cavity. The first conductive pattern 221 may be built up from an upper surface of the first insulating layer 210 to an upper side thereof, and the second conductive pattern 222 may be built up from a lower surface of the first insulating layer 210 to a lower side thereof.

For example, since at least one of the first and second conductive patterns 221 and 222 may be electrically connected to a substrate via 225 penetrating through the first insulating layer 210, the first and second conductive patterns 221 and 222 may be electrically connected to the upper and lower sides of the multilayer capacitor-embedded board 200, respectively. Alternately, the first and second conductive patterns 221 and 222 may be electrically connected to only the upper side or only the lower side of the multilayer capacitor-embedded board 200.

First and second solder resist layers 241 and 242 may be respectively disposed on an uppermost side and a lowermost side of the multilayer capacitor-embedded substrate 200, and may contain a solder resist.

For example, the first conductive pattern 221 may include a plurality of first conductive patterns 221a, 221b, 221c, and 221d, and the second conductive pattern 222 may include a plurality of second conductive patterns 222a, 222b, 222c, 222d. The plurality of first conductive patterns 221a, 221b, 221c, and 221d may be connected through a first interlayer via 223, and the plurality of second conductive patterns 222a, 222b, 222c, and 222d may be connected through a second interlayer via 224.

The multilayer capacitor 100 may be disposed in a cavity of the first insulating layer 210, and the first external electrode 131 of the multilayer capacitor 100 may be electrically connected to the first conductive pattern 221 and the second external electrode 132 of the multilayer capacitor 100 may be electrically connected to the second conductive pattern 222.

The smaller the multilayer capacitor-embedded substrate 200, the smaller a maximum volume which the cavity of the first insulating layer 210 may have. The maximum volume may serve as a size limitation for embedding the multilayer capacitor 100.

Since the multilayer capacitor 100 according to an embodiment may have high capacitance compared with the volume of the body 110 in spite of miniaturization of the multilayer capacitor 100, the multilayer capacitor 100 may be stably embedded in the board 200 even when a size of the board 200 is decreased.

Figure 4:
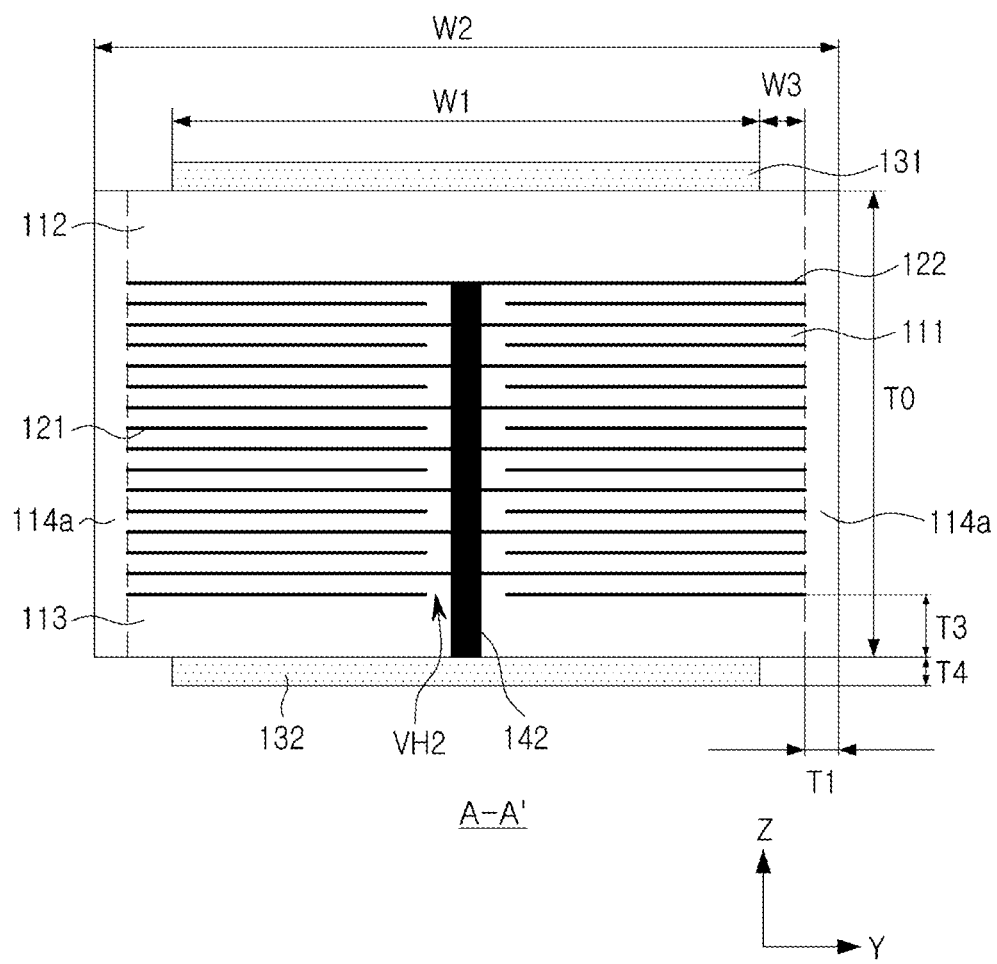
FIG. 4 is a cross-sectional view taken along line A-A' of FIG. 1.
Figure 5:
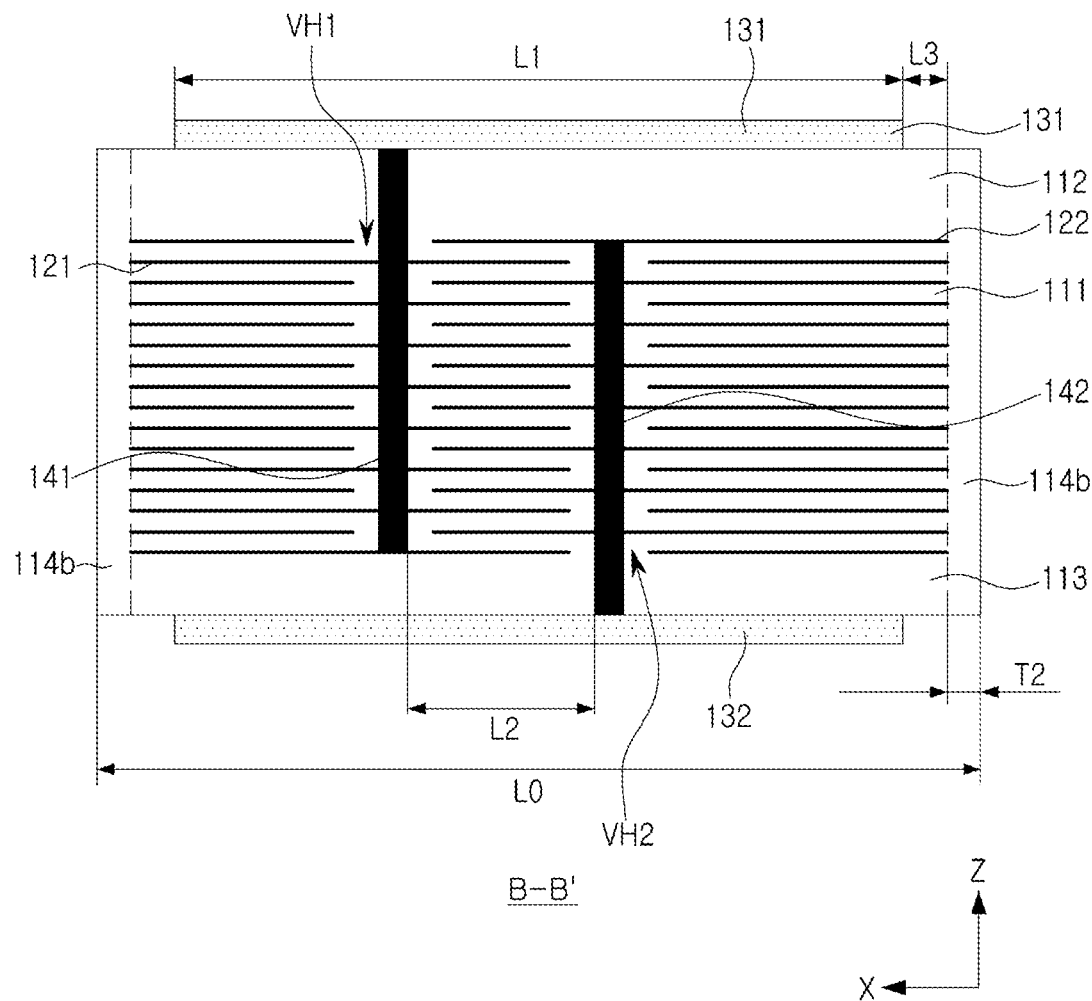
FIG. 5 is a cross-sectional view taken along line B-B' of FIG. 1.

The widths and the thicknesses W1, W2, W3, T0, T1, T3, and T4 illustrated in FIG. 4 may be measured in an A-A' cross-section of FIG. 4 exposed by grinding the multilayer capacitor 100 in the X-direction to expose a Y-Z plane including a center of a first via electrode 141 and a center of a second via electrode 142 or cutting the multilayer capacitor 100 in the Y-Z plane. The lengths L0, L1, L2, L3, and T2 illustrated in FIG. 5 may be measured in an B-B' cross-section of FIG. 4 exposed by grinding the multilayer capacitor 100 in the Y-direction to expose a X-Z plane including the center of the first via electrode 141 and the center of the second via electrode 142 or cutting the multilayer capacitor 100 in the X-Z plane. A measurement apparatus, such as a transmission electron microscopy (TEM), an atomic force microscope (AFM), a scanning electron microscope (SEM), optical microscope, and surface profiler, may obtain an image of the A-A' cross-section or the B-B' cross-section, and components may be identified through classification of color and/or brightness of each pixel of the image. The widths W1, W2, and W3 may be calculated by averaging values obtained by dividing the number of Z coordinates by the sum of W1, W2, and W3 for each Z coordinate of the corresponding components of the A-A' cross-section. The thicknesses T0, T1, T3, and T4 may be calculated by averaging values obtained by dividing the number of Y coordinates by the sum of T0, T1, T3, and T4 for each Y coordinate of the corresponding components of the B-B' cross-section. The lengths L0, L1, L2, and L3 may be calculated by averaging values obtained by dividing the number of Z coordinates by the sum of L0, L1, L2, and L3 for each Z coordinate of the corresponding components of the B-B' cross-section. The thickness T2 may be calculated by averaging values obtained by dividing the number of the X coordinates by the sum of T2 for each X coordinates of the corresponding component of the B-B' cross-section.

As described above, the multilayer capacitor according to an embodiment may have high capacitance compared with a total effective size, and thus may be advantageous for miniaturization.

Alternatively, the multilayer capacitor may reduce a current path or winding factors of the current path, so that equivalent series inductance (ESL) may be effectively reduced.

While example embodiments have been shown and described above, it will be apparent to those skilled in the art that modifications and variations could be made without departing from the scope of the present invention as defined by the appended claims.

What is claimed is:

1. A multilayer capacitor comprising:
   a body including a capacitance region in which at least one first internal electrode and at least one second internal electrode are alternately laminated in a first direction with at least one dielectric layer interposed therebetween; and
   first and second external electrodes spaced apart from each other and respectively disposed on first and second surfaces of the body, the first and second surfaces opposing each other,
   wherein
   the body further includes a first via electrode, connecting the at least one first internal electrode and the first external electrode to each other in the first direction, and a second via electrode connecting the at least one second internal electrode and the second external electrode to each other in the first direction, the first external electrode covers the first surface of the body by an area exceeding half of the first surface and is spaced apart from each edge of the first surface, and the second external electrode covers the second surface of the body by an area exceeding half of the second surface and is spaced apart from each edge of the second surface.

2. The multilayer capacitor of claim 1, wherein
the body has third and fourth surfaces opposing each other in a second direction, perpendicular to the first direction, and fifth and sixth surfaces opposing each other in a third direction, perpendicular to the first and second directions, and
a thickness of the body in the first direction is smaller than a width of the body in the second direction and smaller than a length of the body in the third direction.

3. The multilayer capacitor of claim 1, wherein
the body has third and fourth surfaces opposing each other in a second direction, perpendicular to the first direction, and fifth and sixth surfaces opposing each other in a third direction, perpendicular to the first and second directions, and
the body is configured to exclude a path electrically connected to the at least one first internal electrode and the at least one second internal electrode, through the third, fourth, fifth, and sixth surfaces of the body.

4. The multilayer capacitor of claim 1, wherein
the body has third and fourth surfaces opposing each other in a second direction, perpendicular to the first direction, and fifth and sixth surfaces opposing each other in a third direction, perpendicular to the first and second directions, and
the body further includes first and second side margin layers, disposed such that the capacitance region is disposed between the first and second side margin layers in the second direction, and third and fourth side margin layers disposed such that the capacitance region is disposed between the third and fourth side margin layers in the third direction.

5. The multilayer capacitor of claim 4, wherein
each of the first, second, third, and fourth side margin layers is in contact with each of the at least one first internal electrode and the at least one second internal electrode.

6. The multilayer capacitor of claim 5, wherein
a thickness of each of the first, second, third, and fourth side margin layers is greater than 0 μm and 20 μm or less.

7. The multilayer capacitor of claim 4, wherein
the body further includes a first cover layer, disposed between the first external electrode and the capacitance region, and a second cover layer disposed between the second external electrode and the capacitance region, and
a thickness of each of the first, second, third, and fourth side margin layers is less than a thickness of each of the first and second cover layers.

8. The multilayer capacitor of claim 7, wherein
each of the at least one dielectric layer, the first and second cover layers, and the first, second, third, and fourth side margin layers contains a barium titanate ($BaTiO_3$)-based ceramic material.

9. The multilayer capacitor of claim 1, wherein
portions of the first and second external electrodes in contact with the first and second via electrodes are plating layers.

10. The multilayer capacitor of claim 1, wherein
a thickness of each of the first and second external electrodes is greater than 0 μm and 10 μm or less.

11. The multilayer capacitor of claim 1, wherein
a gap between the first and second via electrodes is smaller than half of a length of the body in a direction in which the first and second via electrodes face each other.

12. The multilayer capacitor of claim 1, wherein
a number of via electrodes present in the body is two, including the first and second via electrodes.

13. The multilayer capacitor of claim 1, wherein
the first via electrode is not exposed to the second surface of the body, and
the second via electrode is not exposed to the first surface of the body.

14. A board comprising:
a first insulating layer having a cavity;
a first conductive pattern disposed on a first surface of the first insulating layer;
a second conductive pattern disposed on a second surface of the first insulating layer; and
the multilayer capacitor of claim 1 embedded in the board and disposed in the cavity, wherein
the first external electrode of the multilayer capacitor is electrically connected to the first conductive pattern, and
the second external electrode of the multilayer capacitor is electrically connected to the second conductive pattern.

15. A multilayer capacitor comprising:
a body including a capacitance region in which at least one first internal electrode and at least one second internal electrode are alternately laminated in a first direction with at least one dielectric layer interposed therebetween; and
first and second external electrodes spaced apart from each other and respectively disposed on first and second surfaces of the body, the first and second surfaces opposing each other,
wherein
the body further includes a first via electrode, connecting the at least one first internal electrode and the first external electrode to each other in the first direction, and a second via electrode connecting the at least one second internal electrode and the second external electrode to each other in the first direction,
the first external electrode overlaps the second via electrode in the first direction and includes a plating layer being in direct contact with the first via electrode, and
the second external electrode overlaps the first via electrode in the first direction and includes a plating layer being in direct contact with the second via electrode.

16. The multilayer capacitor of claim 15, wherein
the body has third and fourth surfaces opposing each other in a second direction, perpendicular to the first direction, and fifth and sixth surfaces opposing each other in a third direction, perpendicular to the first and second directions, and
a thickness of the body in the first direction is smaller than a width of the body in the second direction and smaller than a length of the body in the third direction.

17. The multilayer capacitor of claim 15, wherein the body has third and fourth surfaces opposing each other in a second direction, perpendicular to the first direction, and fifth and sixth surfaces opposing each other in a third direction, perpendicular to the first and second directions, and the body is configured to exclude a path electrically connected to the at least one first internal electrode and the at least one second internal electrode, through the third, fourth, fifth, and sixth surfaces of the body.

18. The multilayer capacitor of claim 15, wherein the body has third and fourth surfaces opposing each other in a second direction, perpendicular to the first direction, and fifth and sixth surfaces opposing each other in a third direction, perpendicular to the first and second directions, and the body further includes first and second side margin layers, disposed such that the capacitance region is disposed between the first and second side margin layers in the second direction, and third and fourth side margin layers disposed such that the capacitance region is disposed between the third and fourth side margin layers in the third direction.

19. The multilayer capacitor of claim 15, wherein a gap between the first and second via electrodes is smaller than half of a length of the body in a direction in which the first and second via electrodes face each other.

20. The multilayer capacitor of claim 15, wherein a number of via electrodes present in the body is two, including the first and second via electrodes.

21. The multilayer capacitor of claim 15, wherein a midpoint of the first via electrode is offset from a midpoint of the second via electrode along the first direction.

22. The multilayer capacitor of claim 15, wherein ends of the first and second via electrodes are disposed at different depths in the body.

23. The multilayer capacitor of claim 15, wherein the body further includes a first cover layer, disposed between the first external electrode and the at least one first internal electrode, and the second via electrode does not penetrate the first cover layer.

24. The multilayer capacitor of claim 15, wherein the body further includes a second cover layer disposed between the second external electrode and the at least one second internal electrode, and the first via electrode does not penetrate the second cover layer.

\* \* \* \* \*